(12) United States Patent
Leong et al.

(10) Patent No.: US 11,570,903 B2
(45) Date of Patent: Jan. 31, 2023

(54) PROCESS FOR CONFORMAL COATING OF MULTI-ROW SURFACE-MOUNT COMPONENTS IN A LIDLESS BGA PACKAGE AND PRODUCT MADE THEREBY

(71) Applicant: Advanced Micro Devices, Inc., Santa Clara, CA (US)

(72) Inventors: Chiaken Leong, Santa Clara, CA (US); Patrick Kim, Sunnyvale, CA (US)

(73) Assignee: ADVANCED MICRO DEVICES, INC., Santa Clara, CA (US)

( * ) Notice: Subject to any disclaimer, the term of this patent is extended or adjusted under 35 U.S.C. 154(b) by 0 days.

(21) Appl. No.: 16/729,635

(22) Filed: Dec. 30, 2019

(65) Prior Publication Data

US 2021/0120679 A1    Apr. 22, 2021

Related U.S. Application Data

(60) Provisional application No. 62/915,796, filed on Oct. 16, 2019.

(51) Int. Cl.
*H05K 3/28*    (2006.01)
*H05K 1/18*    (2006.01)

(52) U.S. Cl.
CPC ............ *H05K 3/284* (2013.01); *H05K 1/181* (2013.01); *H05K 2201/10015* (2013.01); *H05K 2201/2009* (2013.01); *H05K 2203/1322* (2013.01)

(58) Field of Classification Search
CPC ... H05K 1/11; H05K 1/14; H05K 1/18; H05K 1/181–187; H05K 3/284; H01L 23/16; H01L 23/128; H01L 23/135; H01L 23/48–56; H01L 23/495; H01L 23/552

USPC ......... 361/760–784, 816, 818; 257/659–730; 29/840–852
See application file for complete search history.

(56) References Cited

U.S. PATENT DOCUMENTS

| | | | | |
|---|---|---|---|---|
| 5,394,304 A | * | 2/1995 | Jones | B65B 53/02 |
| | | | | 174/256 |
| 5,639,989 A | * | 6/1997 | Higgins, III | H05K 3/284 |
| | | | | 174/386 |
| 6,313,521 B1 | * | 11/2001 | Baba | H01L 23/10 |
| | | | | 257/659 |

(Continued)

OTHER PUBLICATIONS

European Patent Office; International Search Report and Written Opinion; International Appl. No. PCT/US2020/055733; dated Apr. 22, 2021.

*Primary Examiner* — Tuan T Dinh

(57) ABSTRACT

A process for conformally coating passive surface mount components soldered to a printed circuit substrate of a lidless flip-chip ball grid array package includes affixing a stiffener ring to the substrate before forming a conformal coating on the passive surface mount components. The stiffener ring is affixed to the substrate so that the plurality of passive surface mount components and the integrated circuit die are contained within an opening formed by the stiffener ring. After affixing the stiffener ring to the substrate, the conformal coating is formed on the passive surface mount components. The conformal coating extends over each of the passive surface mount components, around a periphery of each of the passive surface mount components, and under each of the passive surface mount components. A product made according to the process is also disclosed.

34 Claims, 8 Drawing Sheets

(56) References Cited

U.S. PATENT DOCUMENTS

| | | | |
|---|---|---|---|
| 6,596,937 B2* | 7/2003 | Mazurkiewicz | H01L 23/552 |
| | | | 174/394 |
| 8,232,138 B2* | 7/2012 | Lim | H01L 24/83 |
| | | | 438/108 |
| 9,704,812 B1* | 7/2017 | Lam | H01L 23/66 |
| 9,966,278 B1 | 5/2018 | Kim et al. | |
| 10,651,127 B2* | 5/2020 | Kong | H01L 23/5386 |
| 10,964,677 B2* | 3/2021 | Ong | H01L 23/16 |
| 2008/0054490 A1* | 3/2008 | McLellan | H01L 21/563 |
| | | | 257/778 |
| 2008/0284047 A1 | 11/2008 | Tosaya et al. | |
| 2010/0155927 A1* | 6/2010 | Cheah | H01L 23/49833 |
| | | | 257/691 |
| 2010/0184256 A1 | 7/2010 | Chino | |
| 2015/0327410 A1* | 11/2015 | Sherrer | H01Q 23/00 |
| | | | 361/818 |
| 2018/0020546 A1 | 1/2018 | Pepin et al. | |
| 2018/0096967 A1* | 4/2018 | Tsai | H01L 23/585 |
| 2018/0204741 A1 | 7/2018 | Chew | |
| 2018/0204807 A1* | 7/2018 | Aizawa | H01L 23/5383 |
| 2018/0269164 A1* | 9/2018 | Lin | H01L 23/3135 |
| 2018/0374799 A1 | 12/2018 | Kawabata | |

\* cited by examiner

US 11,570,903 B2

PROCESS FOR CONFORMAL COATING OF MULTI-ROW SURFACE-MOUNT COMPONENTS IN A LIDLESS BGA PACKAGE AND PRODUCT MADE THEREBY

CROSS-REFERENCE TO RELATED APPLICATIONS

The present application claims the benefit under 35 U.S.C. § 119(e) of U.S. of Provisional Patent Application No. 62/915,796, entitled PROCESS FOR CONFORMAL COATING OF MULTI-ROW SURFACE-MOUNT COMPONENTS IN A LIDLESS BGA PACKAGE AND PRODUCT MADE THEREBY, filed on Oct. 16, 2019, the entire disclosures of which is expressly incorporated herein.

BACKGROUND OF THE DISCLOSURE

Electronic devices including integrated circuits are used in computing devices such as, but not limited to, laptops, desktops, tablets, smartphones, game consoles, televisions, set top boxes, wearables, internet servers, printers, and other devices. The electronic devices can include integrated circuit die and passive surface mount components, such as chip capacitors, packaged together on the same printed circuit substrate. The chip capacitors can be used for decoupling the integrated circuit from the voltage fluctuations in the power supply, for example. The integrated circuit die can have very dense circuitry and can operate at very high frequencies to provide ever-improving levels of performance. Some integrated circuit die may have multiple processor cores and/or very large memory arrays on relatively small die. In operation, such devices can produce heat in excess of 100 watts. If the heat is allowed to build up on the die, the performance of the integrated circuit may be degraded and/or the life of the integrated circuit may be significantly shortened.

In some electronic devices, the integrated circuit is mounted on the printed circuit substrate of the package in an upside-down, or flip-chip, configuration, so that the bond pads of the integrated circuit die can be directly soldered to the electrical connections of the printed circuit substrate. In such a flip-chip package ball grid array (BGA) package, a package lid is affixed to the printed circuit substrate to protect the die and to provide structural support to the substrate. Before the lid is affixed, a thermally conductive material, also called a thermal interface material (TIM), is applied to the back side of the die to provide a thermally conductive heat path between the die and the package lid. A high-surface area heat sink can be coupled to the package lid so that a convective flow of air can remove heat from the package lid.

In some other electronic devices, a package lid is not used, so that the TIM contacts the heat sink directly. Removing the lid from the heat path can improve the efficiency of heat removal from the integrated circuit die. In such a lidless BGA package, a stiffener ring around the integrated circuit die and the passive surface mount components is affixed to the substrate instead of the lid to provide structural support to the substrate.

BRIEF DESCRIPTION OF THE DRAWINGS

The implementations will be more readily understood in view of the following description when accompanied by the below figures, wherein like reference numerals represent like elements, and wherein.

DETAILED DESCRIPTION OF IMPLEMENTATIONS

Figure 1:
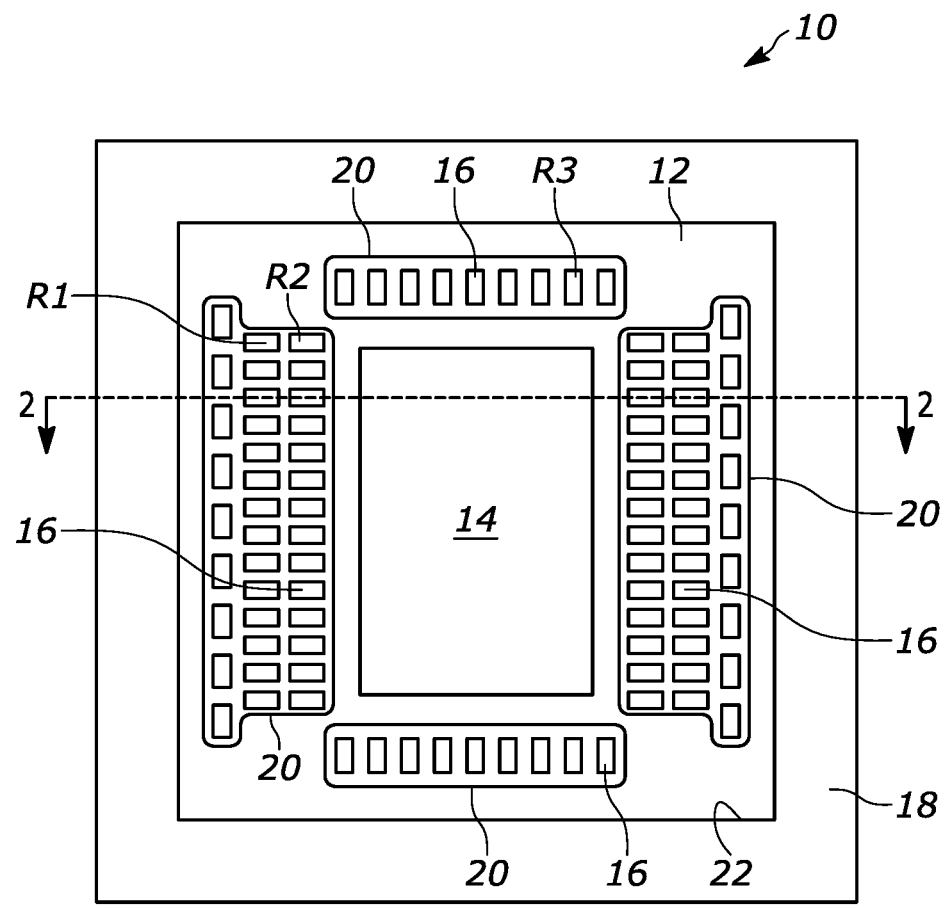
FIG. 1 is a schematic top view of an electronic device in accordance with one example set forth in the disclosure.

Briefly, an electronic device including an integrated circuit die and a plurality of passive surface mount components soldered to a printed circuit substrate of BGA package requires a conformal coating on the passive surface mount components. Passive surfaced mount components can include chip capacitors and/or chip resistors. During later processing at elevated temperatures, such as when the electronic device is soldered to a circuit board, some of the TIM used to form the thermally conductive layer between the integrated circuit die and the heat sink can melt and flow away from the integrated circuit die and contact the passive surface mount components. The TIM is electrically conductive and such contact would short out the passive surface mount component terminals, rendering the electronic device inoperative. The conformal coating electrically insulates the passive surface mount component terminals from the TIM, as well as from any other conductive materials which may contaminate the passive surface mount component terminals.

In a BGA package, the passive surface mount components are typically disposed in a row at the periphery of the integrated circuit die. A conformal coating is formed over the passive surface mount components, and then the lid, or the stiffener ring in the case of a lidless BGA package, is affixed to the package substrate. This works well when there is only one row of passive surface mount components on any of the sides of the integrated circuit die. However, as the integrated circuit die become denser and more complex, multiple adjacent rows of passive surface mount components on at least one of the sides of the integrated circuit die are required. It has been found that a conformal coating formed over the larger area required for multiple adjacent rows of passive surface mount components is prone to coating defects, such as voids in the coating, splitting of the coating and delamination of layers of the coating from each other, as well as from the substrate and the passive surface mount components. The processes described herein provide a conformal coating of multi-row passive surface mount components, such as chip capacitors, in a lidless BGA package that has far fewer, if any, of the voids or splitting of the coating or delamination of the coating layers.

In some implementations, a process for conformally coating passive surface mount components soldered to a printed circuit substrate of a lidless flip-chip ball grid array package includes affixing a stiffener ring to the substrate before forming a conformal coating on the passive surface mount components. The stiffener ring is affixed to the substrate so that the plurality of passive surface mount components and the integrated circuit die are contained within an opening formed by the stiffener ring. After affixing the stiffener ring to the substrate, the conformal coating is formed on the passive surface mount components. The conformal coating extends over each of the passive surface mount components, around a periphery of each of the passive surface mount components, and under each of the passive surface mount components. In some implementations, at least some of the passive surface mount components are disposed in a plurality of adjacent rows. In some implementations, the plurality of passive surface mount components comprises a plurality of chip capacitors. In some implementations, affixing the stiffener ring to the substrate includes adhering the stiffener ring to the substrate with an adhesive, and then curing the adhesive. In some implementations, forming the conformal coating includes forming an undercoating layer on the plurality of passive surface mount components, and then forming a top coating layer over each of the passive surface mount components and the undercoating layer. The undercoating layer extends around the periphery of each of the passive surface mount components and under each of the passive surface mount components between each of the passive surface mount components and the substrate. In some implementations, the undercoating layer and the top coating layer are both cured. In some implementations, the undercoating layer is cured before the top layer is formed.

In some implementations, the substrate and the passive surface mount components are treated with a plasma before forming the conformal coating. In some implementations, the undercoating layer is treated with a plasma before forming the top coating layer. The plasma used to treat the substrate and the passive surface mount components before forming the conformal coating, as well as the plasma use to treat the undercoating layer before forming the top coating layer is formed from gases including helium, argon, oxygen, or any combination of helium, argon and oxygen.

In some implementations, a first adhesion layer is formed on the substrate and on the passive surface mount components before forming the conformal coating on the passive surface mount components. In some implementations, a second adhesion layer is formed on the undercoating layer and on the passive surface mount components before forming the top coating layer.

In some implementations, an electronic device packaged in a lidless flip-chip ball grid array package includes a printed circuit substrate, an integrated circuit die soldered to the substrate, a plurality of passive surface mount components soldered to the substrate, a stiffener ring affixed to the substrate, and a conformal coating disposed over the plurality of passive surface mount components. The substrate includes a ball grid array. The plurality of passive surface mount components and the integrated circuit die are contained within an opening formed by the stiffener ring. At least some of the plurality of passive surface mount components disposed in a plurality of adjacent rows. The device made by affixing a stiffener ring to the substrate and forming a conformal coating on the plurality of passive surface mount components after affixing the stiffener ring to the substrate. The conformal coating extends over each of the passive surface mount components, around a periphery of each of the passive surface mount components, and under each of the passive surface mount components. In some implementations, the plurality of passive surface mount components includes a plurality of chip capacitors. In some implementations, the plurality of passive surface mount components consists of a plurality of chip capacitors.

In some implementations, forming the conformal coating includes forming an undercoating layer on the plurality of passive surface mount components and forming a top coating layer. The undercoating layer extends around the periphery of each of the passive surface mount components and under each of the passive surface mount components between each of the passive surface mount components and the substrate. The top coating layer is disposed over each of the passive surface mount components and over the undercoating layer extending around the periphery of each of the passive surface mount components.

In some implementations, the device is further made by forming a first adhesion layer on the substrate and on the plurality of passive surface mount components before forming the conformal coating on the plurality of passive surface mount components. In some implementations, the device is further made by forming a second adhesion layer on the undercoating layer and the plurality of surface mount components before forming the top coating layer. In some implementations, the device is further made by treating the substrate and the plurality of passive surface mount components with a first plasma before forming the undercoating layer, the first plasma formed from gases including helium, argon, oxygen or any combination thereof. In some implementations, the device is further made by treating the undercoating layer and a top of the passive surface mount components with a second plasma, the second plasma formed from gases including helium, argon, oxygen or any combination thereof.

In some implementations, a process for conformally coating a plurality of passive surface mount components soldered to a printed circuit substrate of a lidless flip-chip ball grid array package containing an integrated circuit die soldered to the substrate and a stiffener ring affixed to the substrate includes forming a first adhesion layer on the substrate and on each of the passive surface mount components. Then an undercoating layer is formed on the first adhesion layer, the undercoating layer extending around the periphery of each of the passive surface mount components and under each of the passive surface mount components, and between each of the passive surface mount components and the substrate. Then a second adhesion layer is formed on the undercoating layer and on each of the passive surface mount components. Then a top coating layer is formed on the second adhesion layer. In some implementations, at least some of the passive surface mount components are disposed in a plurality of adjacent rows. In some implementations, the plurality of passive surface mount components comprises a plurality of chip capacitors. In some implementations, the plurality of passive surface mount components consists of a plurality of chip capacitors. In some implementations, the undercoating layer is cured before the top coating layer is formed. In some implementations, the process further includes treating the substrate and the passive surface mount components with a first plasma before forming the first adhesion layer. In some implementations, the first plasma is formed from gases including helium, argon, oxygen or any combination of helium, argon and oxygen. In some implementations, the process further includes treating the undercoating layer with a second plasma before forming the second adhesion layer. In some implementations, the second plasma is formed from gases including helium, argon, oxygen or any combination of helium, argon and oxygen.

In some implementations, an electronic device includes a printed circuit substrate including a ball grid array, an integrated circuit die soldered to the substrate, a plurality of passive surface mount components soldered to the substrate, a stiffener ring affixed to the substrate and a conformal coating disposed over the passive surface mount components. The passive surface mount components are disposed in a plurality of adjacent rows. The passive surface mount components and the integrated circuit die are contained within an opening formed by the stiffener ring. The conformal coating includes a first adhesion layer, an undercoating layer, a second adhesion layer and a top coating layer. The first adhesion layer is disposed on the substrate and on each of the passive surface mount components. The undercoating layer is disposed on the first adhesion layer and extends around the periphery of each of the passive surface mount components and under each of the passive surface mount components, between each of the passive surface mount components and the substrate. The second adhesion layer is disposed on the undercoating layer and on each of the passive surface mount components. The top coating layer is disposed on the second adhesion layer. In some implementations, the plurality of passive surface mount components comprises a plurality of chip capacitors. In some implementations, the plurality of passive surface mount components consists of a plurality of chip capacitors. In some implementations, the integrated circuit die includes a plurality of central processing unit cores.

In some implementations, the first adhesion layer and the second adhesion layer include a phosphonate-based self-assembled monolayer. In some implementations, the undercoating layer includes at least one polymer formed from resins selected from the group of an epoxy phenolic resin and an epoxy amine resin. In some implementations, the top coating layer includes at least one polymer selected from the group of: a silicone elastomer, an acrylated urethane and a polymer from a modified epoxy phenolic resin or a modified amine resin.

In some implementations, a process for conformally coating passive surface mount components soldered to a printed circuit substrate of a lidless flip-chip ball grid array package includes affixing a stiffener ring to the substrate before forming a conformal coating on the passive surface mount components. The stiffener ring is affixed to the substrate so that the plurality of passive surface mount components and the integrated circuit die are contained within an opening formed by the stiffener ring. After affixing the stiffener ring to the substrate, the conformal coating is formed on the passive surface mount components. The conformal coating extends over each of the passive surface mount components, around a periphery of each of the passive surface mount components, and under each of the passive surface mount components. Forming the conformal coating includes forming an undercoating layer on the plurality of passive surface mount components, curing the undercoating layer, forming a first top coating layer over the undercoating layer, curing the first top coating layer, forming a second top coating layer over each of the passive surface mount components and over the cured first undercoating layer, and curing the second top coating layer. The undercoating layer extends around the periphery of each of the passive surface mount components and under each of the passive surface mount components between each of the passive surface mount components and the substrate. In some implementations, the plurality of passive surface mount components includes a plurality of chip capacitors. In some implementations, the plurality of passive surface mount components consists of a plurality of chip capacitors.

In some implementations, curing the first top coating layer includes baking first top coating layer at a temperature from 95° C. to 105° for from 50 minutes to 70 minutes, and then baking the first top coating layer at a temperature from 145° C. to 155° C. for from 110 minutes to 130 minutes. In some implementations, curing the second top coating layer includes baking second top coating layer at a temperature from 95° C. to 105° for from 50 minutes to 70 minutes; and baking the second top coating layer at a temperature from 145° C. to 155° C. for from 110 minutes to 130 minutes.

In some implementations, the substrate and the passive surface mount components are treated with a plasma before forming the conformal coating. In some implementations, the undercoating layer is treated with a plasma before forming the first top coating layer. The plasma used to treat the substrate and the passive surface mount components before forming the conformal coating, as well as the plasma use to treat the undercoating layer before forming the first top coating layer is formed from gases including helium, argon, oxygen, or any combination of helium, argon and oxygen.

In some implementations, a first adhesion layer is formed on the substrate and on the passive surface mount components before forming the conformal coating on the passive surface mount components. In some implementations, a second adhesion layer is formed on the undercoating layer and on the passive surface mount components before forming the first top coating layer.

In some implementations, an electronic device packaged in a lidless flip-chip ball grid array package includes a printed circuit substrate, an integrated circuit die soldered to the substrate, a plurality of passive surface mount components soldered to the substrate, a stiffener ring affixed to the substrate, and a conformal coating disposed over the plurality of passive surface mount components. The substrate includes a ball grid array. The plurality of passive surface mount components and the integrated circuit die are contained within an opening formed by the stiffener ring. At least some of the plurality of passive surface mount components disposed in a plurality of adjacent rows. The device made by affixing a stiffener ring to the substrate and forming a conformal coating on the plurality of passive surface mount components after affixing the stiffener ring to the substrate. The conformal coating extends over each of the passive surface mount components, around a periphery of each of the passive surface mount components, and under each of the passive surface mount components. Forming the conformal coating includes forming an undercoating layer on the plurality of passive surface mount components, curing the undercoating layer, forming a first top coating layer over the undercoating layer, curing the first top coating layer, forming a second top coating layer over each of the passive surface mount components and over the cured first undercoating layer, and curing the second top coating layer. The undercoating layer extends around the periphery of each of the passive surface mount components and under each of the passive surface mount components between each of the passive surface mount components and the substrate. In some implementations, the plurality of passive surface mount components includes a plurality of chip capacitors. In some implementations, the plurality of passive surface mount components consists of a plurality of chip capacitors.

In some implementations, curing the first top coating layer includes baking first top coating layer at a temperature from 95° C. to 105° for from 50 minutes to 70 minutes, and then baking the first top coating layer at a temperature from 145° C. to 155° C. for from 110 minutes to 130 minutes. In some implementations, curing the second top coating layer includes baking second top coating layer at a temperature from 95° C. to 105° for from 50 minutes to 70 minutes; and baking the second top coating layer at a temperature from 145° C. to 155° C. for from 110 minutes to 130 minutes.

In some implementations, a first adhesion layer is formed on the substrate and on the passive surface mount components before forming the conformal coating on the passive surface mount components. In some implementations, a second adhesion layer is formed on the undercoating layer and on the passive surface mount components before forming the first top coating layer.

In some implementations, the substrate and the passive surface mount components are treated with a plasma before forming the conformal coating. In some implementations, the undercoating layer is treated with a plasma before forming the first top coating layer. The plasma used to treat the substrate and the passive surface mount components before forming the conformal coating, as well as the plasma use to treat the undercoating layer before forming the first top coating layer is formed from gases including helium, argon, oxygen, or any combination of helium, argon and oxygen.

FIG. 1 is a schematic top view of example of an electronic device 10 that includes a printed circuit substrate 12, an integrated circuit die 14, a plurality of chip capacitors 16, a stiffener ring 18 and a conformal coating 20. The integrated circuit die 14 can be a central processing unit, a graphics processing unit, or a combined accelerated processing unit, for example. In some embodiments, the integrated circuit die 14 includes multiple processing cores. In some embodiments, the stiffener ring 18 is a rigid, square-shaped hoop forming an opening 22. In some other embodiments, the stiffener ring 18 can be a hoop having a shape other than square, such as a circle or a rectangle, for example. The conformal coating 20 is described in detail in reference to FIGS. 3, 4 and 5 below. As show in FIG. 1, some of the chip capacitors 16 are arranged in multiple rows, such as those in a first row $R_1$ and a second row $R_2$. Some of the other chip capacitors 16 are arranged in a third row $R_3$. The first row $R_1$ and the second row $R_2$ are adjacent rows. The third row $R_3$ does not have an adjacent row of chip capacitors 16. As shown in in FIG. 1, the contiguous area covered by the conformal coating 20 for the chip capacitors 16 arranged in multiple rows, such as those in the first row $R_1$ and the second row $R_2$ is greater than the contiguous area covered by the conformal coating 20 for the chip capacitors 16 arranged in the third row $R_3$.

Figure 2:
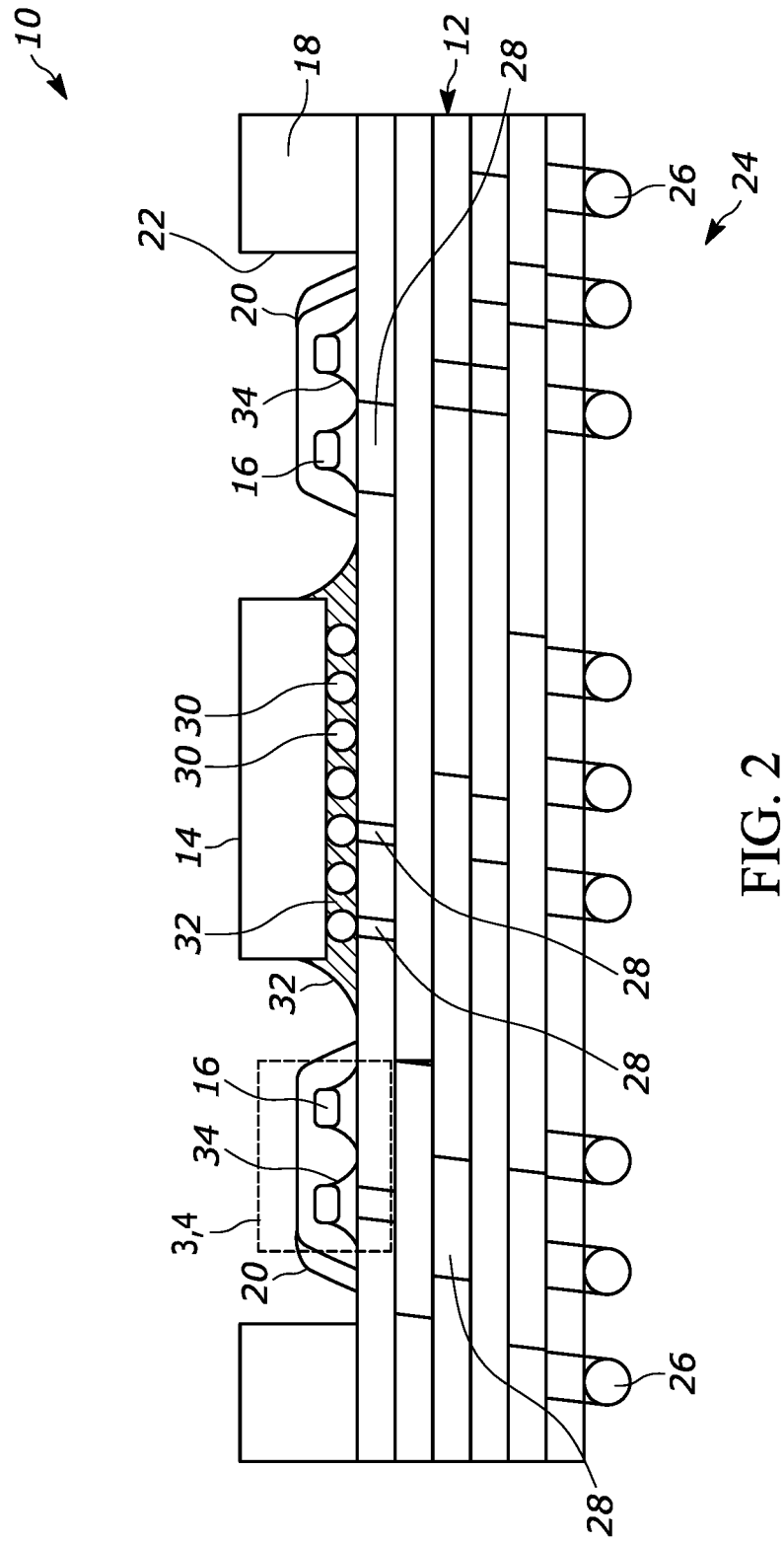
FIG. 2 is a schematic side cross-sectional view of the electronic device of FIG. 1 in accordance with one example set forth in the disclosure.

Referring also to FIG. 2, the electrical device 10 further includes a ball grid array 24 including a plurality of solder balls 26 disposed on a surface of the substrate 12 opposite the integrated circuit die 14. The ball grid array 24 can be used to electrically and mechanically connect the electrical device 10 to a larger printed circuit board (not shown) as a component of any of a number of computing devices such as, but not limited to, laptops, desktops, tablets, smartphones, game consoles, televisions, set top boxes, wearables, internet servers, and printers, to name a few. The printed circuit substrate 12 is a laminated substrate including a plurality of interconnections 28. The integrated circuit die 14 is electrically coupled to the plurality of interconnections 28 and mechanically affixed to the substrate 12 by a plurality of solder joints 30. A die underfill 32 is disposed around the integrated circuit die 14 and the solder joints 20, filling space between the integrated circuit die 14 and the substrate 12. The die underfill 32 is a non-conductive polymer. The die underfill 32 prevents any melted TIM (not shown) or other conductive contamination from shorting any of the solder joints 30 together. The chip capacitors 16 are electrically coupled to the plurality of interconnections 28 and mechanically affixed to the substrate 12 by a plurality of solder joints 34. Specifically, the solder joints 34 electrically connect terminals (not shown) of the chip capacitors 16 to the plurality of interconnections 28. The interconnections 28 electrically interconnect the integrated circuit die 14, the chip capacitors 16 and the solder balls 26 of the ball grid array 24. As shown in FIGS. 1 and 2 together, the integrated circuit die 14 and the plurality of chip capacitors 16 are contained within the opening 22 formed by the stiffener ring 18.

Figure 3:
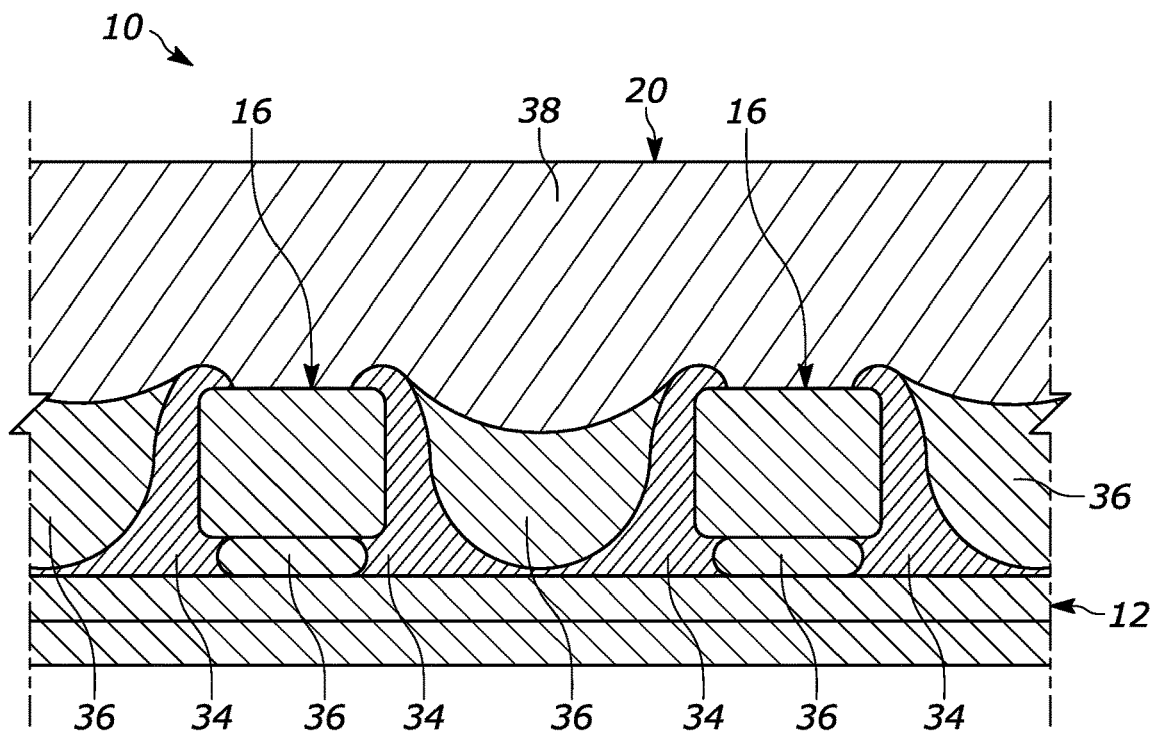
FIG. 3 is an enlarged schematic side cross-sectional view of a portion of the electronic device of FIG. 1 in accordance with one example set forth in the disclosure.

Referring also to FIG. 3, the conformal coating 20 includes an undercoating layer 36 and a top coating layer 38. The undercoating layer 36 extends around a periphery of each of the chip capacitors 16 and under each of the chip capacitors 16 between the chip capacitors 16 and the substrate 12. Although not shown in FIG. 3, the capillary action which forms the undercoating layer 36 between the chip capacitors 16 and the substrate 12, may also cause the undercoating layer 36 to further extend to the top of each of the chip capacitors 16. The top coating layer 38 is disposed over each of the chip capacitors 16 and over the undercoating 36, extending around the periphery of the chip capacitors 16. So disposed, the conformal coating 20 physically and electrically isolates the chip capacitors 16 from conductive contaminants, such as TIM.

In some embodiments, the undercoating layer 36 is an epoxy-based polymer. The undercoating layer 36 is formed from an underfill resin, such as an epoxy phenolic resin, such as U8439-105 or an epoxy amine resin, such as U8410-119A, available from Namics Corporation, Japan. Other suitable underfill resins include U8443-14, U8410-73C, U8410-314A, U8439-1, U8410-207, available from Namics Corporation; UF-5016-MP03, available from the KCC Corporation, Seoul, South Korea; and CRP-4152R5, available from Sumitomo Bakelite Co., Ltd., Manchester, Conn.

In some embodiments, the top coating layer 38 is formed from a coating resin, such as Dowsil™ EA 6900, or Dowsil™ SE 4450, available from Dow Chemical Corporation, Midland, Mich., to form a silicone elastomer; or Dymax® 9482, available from Dymax Corporation, Torrington, Conn., to form an acrylated urethane. Other suitable coating resins include Loctite Resinol 90C, Loctite 3515 and Loctite FP4470, available from Henkel Corporation, Rocky Hill, Conn.; DAPCO™ 3003, available from Solvay USA, Chicago, Ill., EW-3011, available from 3M, St. Paul, Minn., or a modified epoxy phenolic resin or a modified amine resin, available from Namics Corporation.

Figure 4:
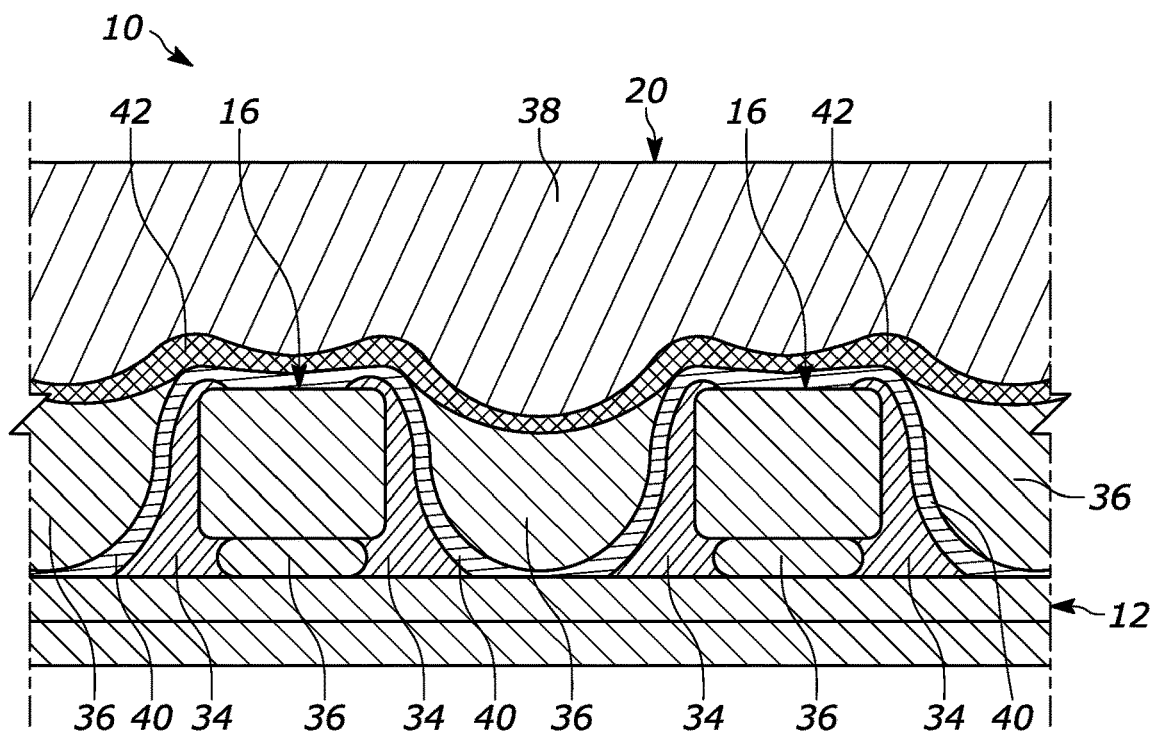
FIG. 4 is an enlarged schematic side cross-sectional view of a portion of the electronic device of FIG. 1 in accordance with another example set forth in the disclosure.

Referring also to FIG. 4, in some embodiments, the conformal coating 20 further includes a first adhesion layer 40 and a second adhesion layer 42. The first adhesion layer 40 is disposed on the substrate 12 and on each of the chip capacitors 16. In the example of FIG. 4, the undercoating layer 36 is disposed on the first adhesion layer 40 and extends around a periphery of each of the chip capacitors 16 and under each of the chip capacitors 16 between the chip capacitors 16 and the substrate 12. The second adhesion layer 42 is disposed on the undercoating layer 36 and on each of the chip capacitors 16. The top coating layer 38 is disposed over the second adhesion layer 42. As with the example of FIG. 3, the conformal coating 20 physically and electrically isolates the chip capacitors 16 from conductive contaminants, such as TIM.

In some embodiments, the first adhesion layer 40 and the second adhesion layer 42 are a phosphonate-based self-assembled monolayer, such as the adhesion primers available from Aculon Inc., San Diego, Calif.

Figure 5:
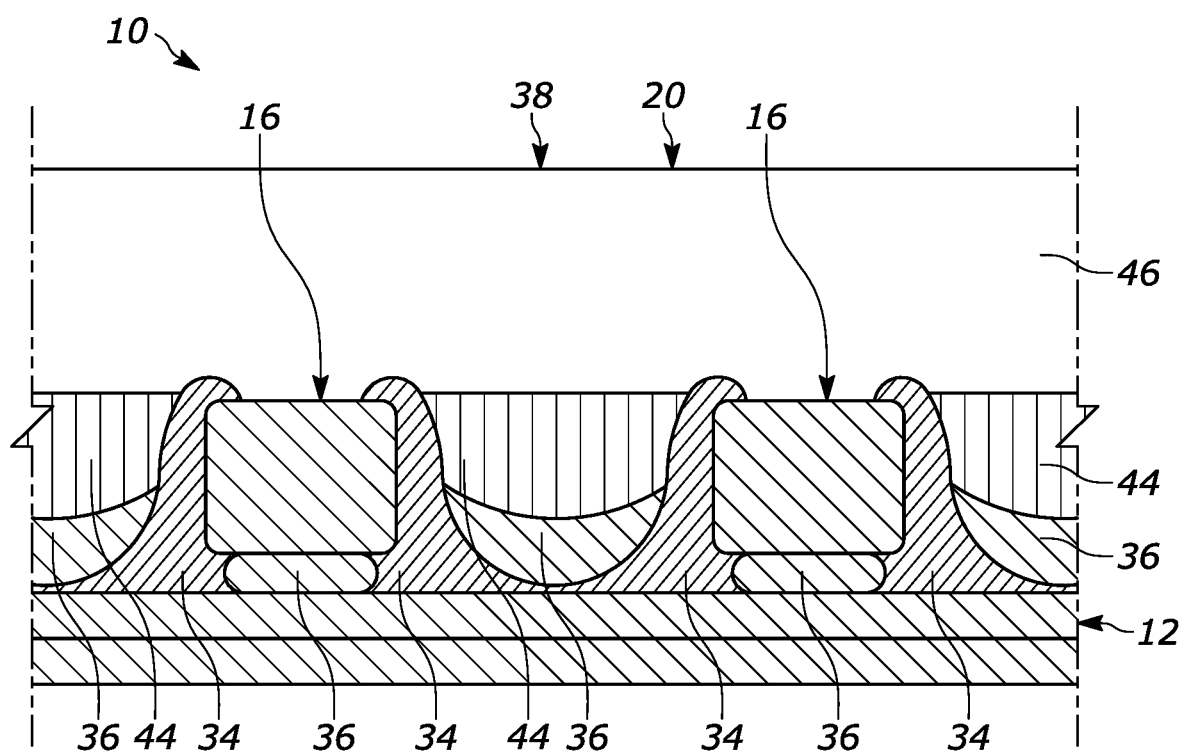
FIG. 5 is an enlarged schematic side cross-sectional view of a portion of the electronic device of FIG. 1 in accordance with another example set forth in the disclosure.

Referring also to FIG. 5, in some embodiments, the top coating layer 38 includes a first top coating layer 44 and a second top coating layer 46. The first top coating layer 44 is disposed on the undercoating layer 36. As shown in the example of FIG. 5, the first top coating layer 44 extends around a periphery of each of the chip capacitors 16 and planarizes gaps between the chip capacitors 16. The second top coating layer 46 is disposed on the first top coating layer 44 and on each of the chip capacitors 16. As with the example of FIG. 3, the conformal coating 20 physically and electrically isolates the chip capacitors 16 from conductive contaminants, such as TIM.

In some embodiments, the first top coating layer 44 and the second top coating layer 46 are formed of the coating resins as described above for the top coating layer 38. In some embodiments, the first top coating layer 44 and the second top coating layer 46 are formed of the same coating resin. In some other embodiments, the first top coating layer 44 and the second top coating layer 46 are formed of different coating resins. In some embodiments, the first top coating layer 44 is formed of an epoxy-based polymer as described above for the undercoating layer 36 and the second top coating layer 46 is formed of a coating resins as described above for the top coating layer 38.

In various embodiments, a thickness of the conformal coating 20, as measured from the substrate 12 to a surface of the top coating layer 38 opposite the substrate 12, may be as little as 600 microns, 625 microns, 650 microns or 675 microns, or as high as great as 700 microns, 725 microns or 750 microns, or be within any range defined between any two of the foregoing values, such as 600 microns to 750 microns, 625 microns to 725 microns, 650 microns, to 700 microns, 675 microns to 700 microns, 675 microns to 725 microns, 700 microns to 750 microns, 700 microns to 725 microns, or 725 microns to 750 microns, for example. The relative thicknesses of the various layers in FIGS. 1-5, such as the undercoating layer 36 and the first adhesion layer 40 shown in FIG. 4, for example, are for ease of illustration and understanding, and are not to scale.

Figure 6:
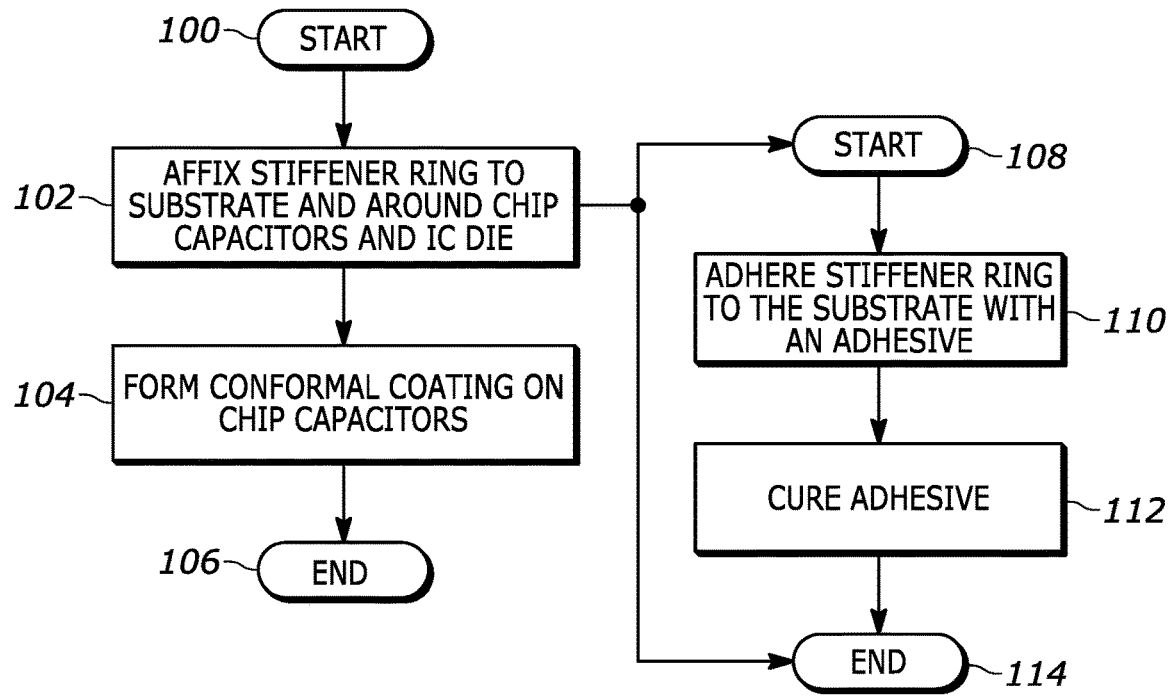
FIG. 6 is a flowchart illustrating a process for conformally coating a plurality of passive surface mount components in accordance with one example set forth in the disclosure.

FIG. 6 is a flowchart illustrating a process for conformally coating the plurality of chip capacitors 16 in accordance with one example set forth in the disclosure. As shown in block 100, the process starts, for example, with the integrated circuit die 14 and the plurality of chip capacitors 16 soldered to the substrate 12, as shown in FIG. 1. The stiffener ring 18 is affixed to the substrate 12 at block 102 such that the integrated circuit die 14 and the plurality of chip capacitors 16 are contained within the opening 22. After block 102, the conformal coating is formed on the plurality of chip capacitors 16 at block 104. The process then continues as shown in block 106 to produce the electrical device 10 with the conformally coated chip capacitors 16. It has been found that by affixing the stiffener ring 102 to the substrate 12 before forming the conformal coating 20 on the chip capacitors 16, the conformal coating 20 has far fewer, if any, of voids in or splitting of the conformal coating 20 or delamination of the undercoating layer 36 and the top coating layer 38 when compared to forming the conformal coating 20 on the multi-row of the plurality of chip capacitors 16 after affixing the stiffener ring 18 to the substrate 12.

As further shows in FIG. 6, the process of affixing the stiffener ring 18 to the substrate 12 starts, for example, with the integrated circuit die 14 and the plurality of chip capacitors 16 soldered to the substrate 12, as shown in block 108. The stiffener ring 18 is adhered to the substrate 12 with an adhesive, such as a silicone adhesive, for example, at block 110. In an embodiment, the adhesive is applied to the substrate 12 and then the stiffener ring 18 is placed on the adhesive. Alternatively, or additionally, the adhesive is applied to the stiffener ring 18 and then the stiffener ring 18 with the adhesive is placed on the substrate 12. Once the stiffener ring 18 is adhered to the substrate 12, the adhesive is cured at block 112. The process then continues as shown in block 114 to produce the stiffener ring 18 affixed to the substrate 12.

Without wishing to be bound by any theories, it is believed that affixing the stiffener ring 18 to the substrate 12 before forming the conformal coating 20 helps stabilize the substrate 12, reducing the mechanical stresses placed on the conformal coating 20, which would otherwise result in splitting and/or delamination of the coating. It is also believed that affixing the stiffener ring 18 to the substrate 12 before forming the conformal coating 20 avoids cross-contamination that would otherwise result if the conformal coating 20 is applied before the stiffener ring 18 is attached. It is believed that the greater contiguous area covered by the conformal coating 20, the greater the mechanical stresses in the conformal coating 20. Thus, it is believed that this process is most beneficial when the plurality of chip capacitors 16 are disposed in a plurality of adjacent rows, resulting in a greater contiguous area covered by the conformal coating 20 for the chip capacitors 16 compared to the smaller contiguous area covered by the conformal coating 20 for those arranged in a single row (FIG. 1).

Figure 7:
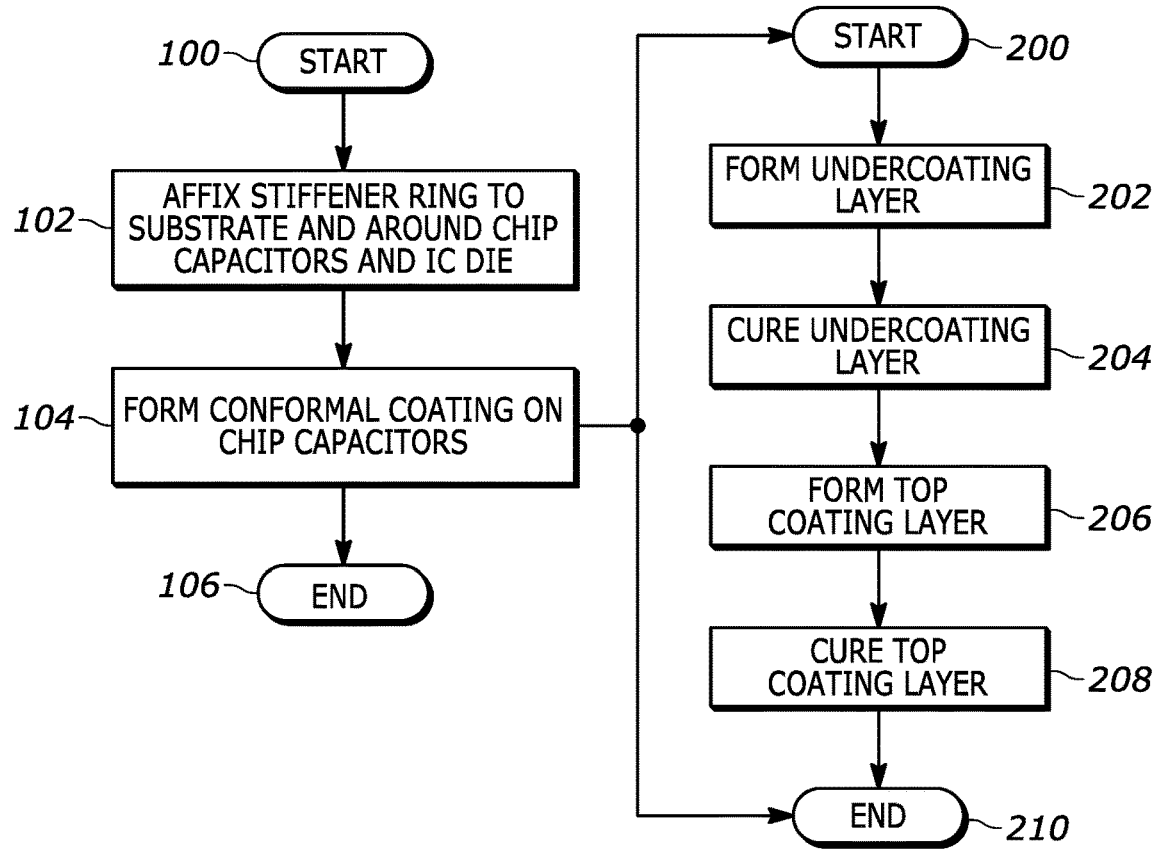
FIG. 7 is a flowchart illustrating another process for conformally coating a plurality of passive surface mount components in accordance with one example set forth in the disclosure.

FIG. 7 is a flowchart illustrating a process for conformally coating the plurality of chip capacitors 16 in accordance with one example set forth in the disclosure. Considering FIGS. 1, 2, 3 and 7 together, the process of forming the conformal coating 20 starts, for example, with the integrated circuit die 14 and the plurality of chip capacitors 16 soldered to the substrate 12 and with the stiffener ring 18 affixed to the substrate 12, as shown at block 200. The undercoating layer 36 is formed by dispensing the underfill resin, as described above, around a periphery of the plurality of chip capacitors 16 at block 202. Capillary action draws some of the underfill resin into the spaces between the plurality of chip capacitors 16 and the substrate 12. The undercoating layer 36 is then cured at block 204. The top coating layer 38 is formed by dispensing the coating resin, as described above, over each of the chip capacitors 16 and over the undercoating layer 36, at block 206. The top coating layer 38 is then cured at block 208. The process then continues as shown in block 210 to produce the electrical device 10 with the conformally coated chip capacitors 16.

In various embodiments, the undercoating layer 36 may be cured at block 204 using a two-step heating process. In a first step of the two-step heating process, the undercoating layer 36 may be heated to a temperature as low as 85° C., 90°

C. or 95° C., or as high as 100° C., 105° C. or 110° C., or to a temperature within any range defined between any two of the foregoing values, such as 85° C. to 110° C., 90° C. to 105° C., 95° C. to 100° C., 95° C. to 105° C., 90° C. to 110° C., or 100° C. to 105° C., for example. In the first step of the two-step heating process, the undercoating layer 36 may be heated for a time as short as 40 minutes, 45 minutes, 50 minutes, 55 minutes or 60 minutes, or as long as 65 minutes, 70 minutes, 75 minutes or 80 minutes, or for a time within any range defined between any two of the foregoing values, such as 40 minutes to 80 minutes, 45 minutes to 75 minutes, 50 minutes to 70 minutes, 55 minutes to 65 minutes, 55 minutes to 60 minutes, 60 minutes to 65 minutes, or 60 minutes to 70 minutes, for example.

In a second step of the two-step heating process, the undercoating layer 36 may be heated to a temperature as low as 130° C., 135° C., 140° C., 145° C. or 150° C., or as high as 155° C., 160° C., 165° C. or 170° C., or to a temperature within any range defined between any two of the foregoing values, such as 130° C. to 170° C., 135° C. to 165° C., 140° C. to 160° C., 145° C. to 155° C., 150° C. to 160° C., or 145° C. to 150° C., for example. In the second step of the two-step heating process, the undercoating layer 36 may be heated for a time as short as 100 minutes, 105 minutes, 110 minutes, 115 minutes or 120 minutes, or as long as 125 minutes, 130 minutes, 135 minutes or 140 minutes, or for a time within any range defined between any two of the foregoing values, such as 100 minutes to 140 minutes, 105 minutes to 135 minutes, 110 minutes to 130 minutes, 115 minutes to 125 minutes, 120 minutes to 130 minutes, 120 minutes to 140 minutes, or 110 minutes to 120 minutes, for example.

In various embodiments, the top coating layer 38 may be cured at block 208 using the two-step heating process as described above for the underlayer coating 36 at block 204. In other various embodiments, the top coating layer 38 may be cured using a single-step heating process. In the single-step heating process, the top coating layer 38 may be heated to a temperature as low as 150° C., 155° C. or 160° C., or as high as 165° C., 170° C. or 175° C., or to a temperature within any range defined between any two of the foregoing values, such as 150° C. to 175° C., 155° C. to 170° C., 160° C. to 165° C., 160° C. to 170° C., 150° C. to 160° C., or 165° C. to 170° C., for example. In the single-step heating process, the top coating layer 38 may be heated for a time as short as 160 minutes, 165 minutes, 170 minutes, 175 minutes or 180 minutes, or as long as 185 minutes, 190 minutes, 195 minutes or 200 minutes, or for a time within any range defined between any two of the foregoing values, such as 160 minutes to 200 minutes, 165 minutes to 195 minutes, 170 minutes to 190 minutes, 175 minutes to 185 minutes, 175 minutes to 185 minutes, 170 minutes to 180 minutes, 180 minutes to 200 minutes or 180 minutes to 190 minutes, for example.

In other various embodiments, the top coating layer 38 may be cured at block 208 using a three-step heating process. In a first step of the three-step heating process, the top coating layer 38 may be heated to a temperature as low as 85° C., 90° C. or 95° C., or as high as 100° C., 105° C. or 110° C., or to a temperature within any range defined between any two of the foregoing values, such as 85° C. to 110° C., 90° C. to 105° C., 95° C. to 100° C., 95° C. to 105° C., 90° C. to 110° C., or 100° C. to 105° C., for example. In the first step of the three-step heating process, the top coating layer 38 may be heated for a time as short as 30 minutes, 35 minutes, 40 minutes or 45 minutes, or as long as 50 minutes, 55 minutes or 60 minutes, or for a time within any range defined between any two of the foregoing values, such as 30 minutes to 60 minutes, 35 minutes to 55 minutes, 40 minutes to 50 minutes, 40 minutes to 45 minutes, 45 minutes to 50 minutes, 35 minutes to 45 minutes, or 45 minutes to 50 minutes, for example.

In a second step of the three-step heating process, the top coating layer 38 may be heated to a temperature as low as 110° C., 115° C. or 120° C., or as high as 125° C., 130° C. or 135° C., or to a temperature within any range defined between any two of the foregoing values, such as 110° C. to 135° C., 115° C. to 130° C., 120° C. to 125° C., 120° C. to 130° C., 115° C. to 135° C., or 125° C. to 130° C., for example. In the second step of the three-step heating process, the top coating layer 38 may be heated for a time as short as 30 minutes, 35 minutes, 40 minutes or 45 minutes, or as long as 50 minutes, 55 minutes or 60 minutes, or for a time within any range defined between any two of the foregoing values, such as 30 minutes to 60 minutes, 35 minutes to 55 minutes, 40 minutes to 50 minutes, 40 minutes to 45 minutes, 45 minutes to 50 minutes, 35 minutes to 45 minutes, or 45 minutes to 50 minutes, for example.

In a third step of the three-step heating process, the top coating layer 38 may be heated to a temperature as low as 130° C., 135° C., 140° C., 145° C. or 150° C., or as high as 155° C., 160° C., 165° C. or 170° C., or to a temperature within any range defined between any two of the foregoing values, such as 130° C. to 170° C., 135° C. to 165° C., 140° C. to 160° C., 145° C. to 155° C., 150° C. to 160° C., or 145° C. to 150° C., for example. In the third step of the three-step heating process, the top coating layer 38 may be heated for a time as short as 100 minutes, 105 minutes, 110 minutes, 115 minutes or 120 minutes, or as long as 125 minutes, 130 minutes, 135 minutes or 140 minutes, or for a time within any range defined between any two of the foregoing values, such as 100 minutes to 140 minutes, 105 minutes to 135 minutes, 110 minutes to 130 minutes, 115 minutes to 125 minutes, 120 minutes to 130 minutes, 120 minutes to 135 minutes, or 115 minutes to 120 minutes, for example.

In other various embodiments, the top coating layer 38 may be cured at block 208 using a four-step heating process. In a first step of the four-step heating process, the top coating layer 38 may be heated to a temperature as low as 85° C., 90° C. or 95° C., or as high as 100° C., 105° C. or 110° C., or to a temperature within any range defined between any two of the foregoing values, such as 85° C. to 110° C., 90° C. to 105° C., 95° C. to 100° C., 95° C. to 105° C., 90° C. to 110° C., or 100° C. to 105° C., for example. In the first step of the four-step heating process, the top coating layer 38 may be heated for a time as short as 15 minutes, 20 minutes, 25 minutes or 30 minutes, or as long as 35 minutes, 40 minutes or 45 minutes, or for a time within any range defined between any two of the foregoing values, such as 15 minutes to 45 minutes, 20 minutes to 40 minutes, 25 minutes to 35 minutes, 25 minutes to 30 minutes, 30 minutes to 35 minutes, 35 minutes to 45 minutes, or 20 minutes to 35 minutes, for example.

In a second step of the four-step heating process, the top coating layer 38 may be heated to a temperature as low as 100° C., 105° C. or 110° C., or as high as 115° C., 120° C., 125° C. or 130° C., or to a temperature within any range defined between any two of the foregoing values, such as 100° C. to 130° C., 105° C. to 125° C., 110° C. to 120° C., 110° C. to 115° C., or 115° C. to 120° C., for example. In the second step of the four-step heating process, the top coating layer 38 may be heated for a time as short as 15 minutes, 20 minutes, 25 minutes or 30 minutes, or as long as 35 minutes, 40 minutes or 45 minutes, or for a time within any range defined between any two of the foregoing values, such as 15 minutes to 45 minutes, 20 minutes to 40 minutes, 25 minutes to 35 minutes, 25 minutes to 30 minutes, 30 minutes to 35 minutes, 35 minutes to 45 minutes, or 20 minutes to 35 minutes, for example.

In a third step of the four-step heating process, the top coating layer 38 may be heated to a temperature as low as 115° C., 120° C. or 125° C., or as high as 130° C., 135° C., 140° C. or 145° C., or to a temperature within any range defined between any two of the foregoing values, such as 115° C. to 145° C., 120° C. to 140° C., 125° C. to 135° C., 130° C. to 135° C., or 125° C. to 130° C., for example. In the third step of the four-step heating process, the top coating layer 38 may be heated for a time as short as 15 minutes, 20 minutes, 25 minutes or 30 minutes, or as long as 35 minutes, 40 minutes or 45 minutes, or for a time within any range defined between any two of the foregoing values, such as 15 minutes to 45 minutes, 20 minutes to 40 minutes, 25 minutes to 35 minutes, 25 minutes to 30 minutes, 30 minutes to 35 minutes, 35 minutes to 45 minutes, or 20 minutes to 35 minutes, for example.

In a fourth step of the four-step heating process, the top coating layer 38 may be heated to a temperature as low as 130° C., 135° C., 140° C., 145° C. or 150° C., or as high as 155° C., 160° C., 165° C. or 170° C., or to a temperature within any range defined between any two of the foregoing values, such as 130° C. to 170° C., 135° C. to 165° C., 140° C. to 160° C., 145° C. to 155° C., 150° C. to 160° C., or 145° C. to 150° C., for example. In the fourth step of the four-step heating process, the top coating layer 38 may be heated for a time as short as 100 minutes, 105 minutes, 110 minutes, 115 minutes or 120 minutes, or as long as 125 minutes, 130 minutes, 135 minutes or 140 minutes, or for a time within any range defined between any two of the foregoing values, such as 100 minutes to 140 minutes, 105 minutes to 135 minutes, 110 minutes to 130 minutes, 115 minutes to 125 minutes, 120 minutes to 130 minutes, 120 minutes to 135 minutes, or 115 minutes to 120 minutes, for example.

Without wishing to be bound by any theory, it is believed that the more gradual heating steps of the two-, three-, and four-step heating processes as applied to the top coating layer 38 at block 208 reduce the shrinkage rate and relieve stresses in the top coating layer 38 during cure, particularly at the corners of the plurality of chip capacitors 16. Relieving stresses in the top coating layer 38 at the corners of the plurality of chip capacitors 16 can reduce delamination of the conformal coating 20 from the plurality of chip capacitors 16.

In various embodiments, a thickness of the conformal coating 20, as measured from the substrate 12 to a surface of the top coating layer 38 opposite the substrate 12, may be as little as 600 microns, 625 microns, 650 microns or 675 microns, or as high as great as 700 microns, 725 microns or 750 microns, or be within any range defined between any two of the foregoing values, such as 600 microns to 750 microns, 625 microns to 725 microns, 650 microns, to 700 microns, 675 microns to 700 microns, 675 microns to 725 microns, 700 microns to 750 microns, 700 microns to 725 microns, or 725 microns to 750 microns, for example.

Figure 8:
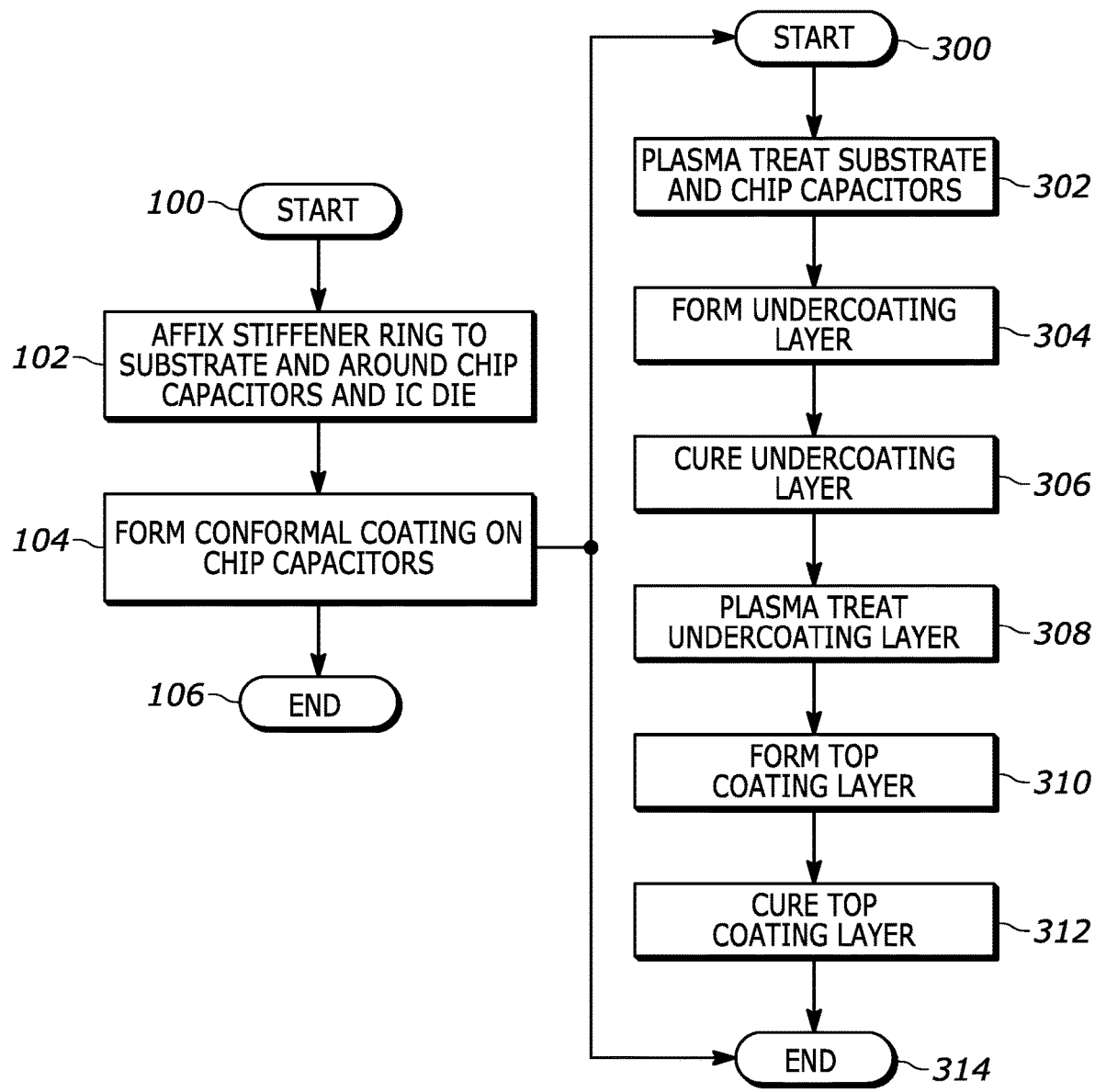
FIG. 8 is a flowchart illustrating another process for conformally coating a plurality of passive surface mount components in accordance with one example set forth in the disclosure.

FIG. 8 is a flowchart illustrating process for conformally coating the plurality of chip capacitors 16 in accordance with another example set forth in the disclosure. Considering FIGS. 1, 2, 3 and 8 together, the process of forming the conformal coating 20 starts, for example, with the integrated circuit die 14 and the plurality of chip capacitors 16 soldered to the substrate 12 and with the stiffener ring 18 affixed to the substrate 12, as shown at block 300.

The substrate 12 and the plurality of chip capacitors 16 are treated with a first plasma at block 302. The first plasma includes helium, argon, oxygen, or any combination of helium, argon, and oxygen. In various embodiments, the first plasma includes a weight percentage (wt. %) of oxygen as low as any one of 5 wt. %, 10 wt. %, 15 wt. %, 20 wt. %, 25 wt. %, 30 wt. %, 35 wt. %, 45 wt. % or 50 wt. %, or as high as 55 wt. %, 60 wt. %, 65 wt. %, 70 wt. %, 75 wt. %, 80 wt. %, 85 wt. %, 90 wt. %, or 95 wt. %, or within any range defined between any two of the foregoing values, such as 5 wt. % to 95 wt. %, 10 wt. % to 90 wt. %, 15 wt. % to 85 wt. %, 20 wt. % to 80 wt. %, 25 wt. % to 75 wt. %, 30 wt. % to 70 wt. %, 35 wt. % to 65 wt. %, 40 wt. % to 60 wt. %, 45 wt. % to 55 wt. %, 50 wt. % to 70 wt. %, 20 wt. % to 30 wt. %, or 80 wt. % to 95 wt. %, for example. In some embodiments, the first plasma consists of oxygen and/or helium and/or argon.

The undercoating layer 36 is formed by dispensing the underfill resin, as described above, around a periphery of the plurality of chip capacitors 16 at block 304. Capillary action draws some of the underfill resin into the spaces between the plurality of chip capacitors 16 and the substrate 12. The undercoating layer 36 is then cured at block 306 by the process described above in reference to block 204 of FIG. 7, for example.

The undercoating layer 36 is treated with a second plasma at block 308. The second plasma includes helium, argon, or oxygen, or any combination of helium, argon and oxygen. In some embodiments, the second plasma includes a weight percentage (wt. %) of oxygen as low as any one of 5 wt. %, 10 wt. %, 15 wt. %, 20 wt. %, 25 wt. %, 30 wt. %, 35 wt. %, 45 wt. % or 50 wt. %, or as high as 55 wt. %, 60 wt. %, 65 wt. %, 70 wt. %, 75 wt. %, 80 wt. %, 85 wt. %, 90 wt. %, or 95 wt. %, or within any range defined between any two of the foregoing values, such as 5 wt. % to 95 wt. %, 10 wt. % to 90 wt. %, 15 wt. % to 85 wt. %, 20 wt. % to 80 wt. %, 25 wt. % to 75 wt. %, 30 wt. % to 70 wt. %, 35 wt. % to 65 wt. %, 40 wt. % to 60 wt. %, 45 wt. % to 55 wt. %, 50 wt. % to 70 wt. %, 20 wt. % to 30 wt. %, or 80 wt. % to 95 wt. %, for example. In some embodiments, the second plasma consists of oxygen and/or helium and/or argon.

The top coating layer 38 is formed by dispensing the coating resin, as described above, over each of the chip capacitors 16 and over the undercoating layer 36, at block 310. The top coating layer 38 is then cured at block 312 by any of the processes described above in reference to block 208 of FIG. 7, for example. The process then continues as shown in block 314 to produce the electrical device 10 with the conformally coated chip capacitors 16.

Without wishing to be bound by any theories, it is believed that the first plasma treatment at block 302 modifies the treated surfaces by generating radicals at the surface which bond more strongly with the undercoating layer 36, and/or by removing contaminants from the treated surfaces which would otherwise interfere with bonding of the undercoating layer 36. The stronger bonding and improved adhesion provided by the first plasma treatment may reduce, or substantially eliminate, the formation of voids between the undercoating layer 36 and the plurality of chip capacitors 16 and the substrate 12, even in the spaces under the chip capacitors 16 between each of the chip capacitors 16 and the substrate 12. Similarly, is it believed that the second plasma treatment at block 308 modifies the undercoating layer 36 surface by generating radicals at the undercoating layer 36 surface which bond more strongly with the top coating layer 38, and/or by removing contaminants from the undercoating layer 36 surface and the plurality of chip capacitors 16 which would otherwise interfere with bonding of the top coating layer 38. The stronger bonding and improved adhesion provided by the second plasma treatment may reduce, or substantially eliminate, the formation of voids between the top coating layer 38 and the undercoating layer 36, and between the top coating layer 38 and the plurality of chip capacitors 16.

Figure 9:
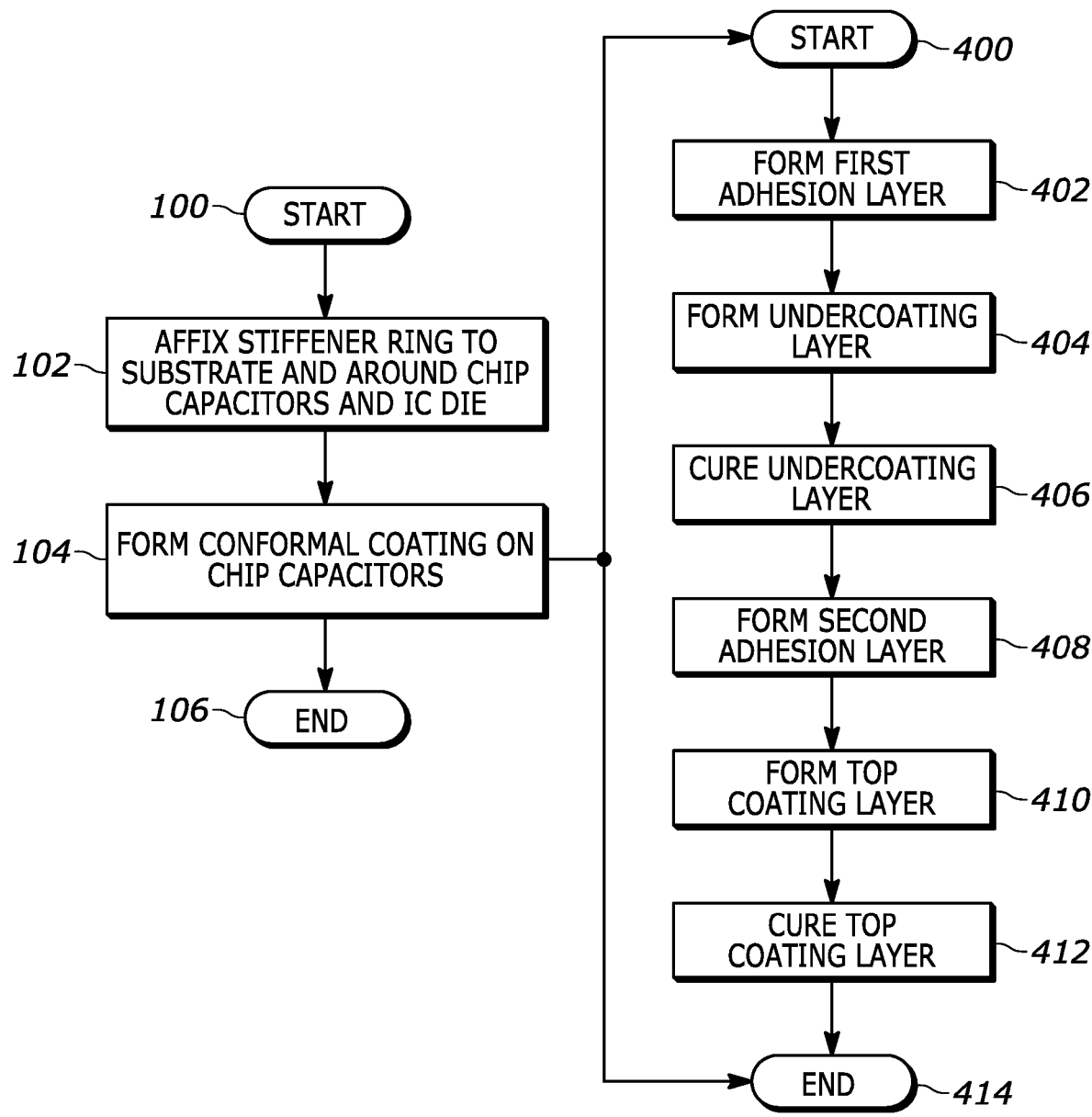
FIG. 9 is a flowchart illustrating another process for conformally coating a plurality of passive surface mount components in accordance with one example set forth in the disclosure.

FIG. 9 is a flowchart illustrating process for conformally coating the plurality of chip capacitors 16 in accordance with another example set forth in the disclosure. Considering FIGS. 1, 2, 4 and 9 together, the process of forming the conformal coating 20 starts, for example, with the integrated circuit die 14 and the plurality of chip capacitors 16 soldered to the substrate 12 and with the stiffener ring 18 affixed to the substrate 12, as shown at block 400. The first adhesion layer 40 is formed on the substrate 12 and the plurality of chip capacitors 16, as shown at block 402. In one embodiment, the first adhesion layer 40 is formed by dispensing the adhesion primer to form a phosphonate-based self-assembled monolayer, for example, as described above. In various embodiment, dispensing of the adhesion primer is by spraying, dipping or wiping the adhesion primer onto the substrate 12 and the plurality of chip capacitors 16.

The undercoating layer 36 is formed by dispensing the underfill resin, as described above, onto the first adhesion layer 40 around a periphery of the plurality of chip capacitors 16 at block 404. Capillary action draws some of the underfill resin into the spaces between the plurality of chip capacitors 16 and the substrate 12. The undercoating layer 36 is then cured at block 406 by the process described above in reference to block 204 of FIG. 7, for example.

The second adhesion layer 42 is formed on the undercoating layer 36 and the plurality of chip capacitors 16, as shown at block 408. In one embodiment, the second adhesion layer 42 is formed by dispensing the adhesion primer to form a phosphonate-based self-assembled monolayer, for example, as described above. In various embodiments, dispensing the adhesion primer is by spraying, dipping or wiping the adhesion primer onto the undercoating layer 36.

The top coating layer 38 is formed by dispensing the coating resin, as described above, over each of the chip capacitors 16 and over the undercoating layer 36, at block 410. The top coating layer 38 is then cured at block 412 by any of the processes described above in reference to block 208 of FIG. 7, for example. The process then continues as shown in block 414 to produce the electrical device 10 with the conformally coated chip capacitors 16.

Without wishing to be bound by any theories, it is believed that the first adhesion later 40 formed at block 402 bonds strongly with the substrate 12 and the plurality of chip capacitors 16, and also bonds strongly with the undercoating layer 36 to tie the undercoating layer 36 to the substrate 12 and the chip capacitors 16. The stronger bonding provided by the first adhesion layer 40 may reduce, or substantially eliminate, the formation of voids and delamination between the undercoating layer 36 and the plurality of chip capacitors 16 and the substrate 12. Similarly, is it believed that the second adhesion layer 42 formed at block 408 bonds strongly with the undercoating layer 36 and the plurality of chip capacitors 16 and with the top coating layer 38 to tie the top coating layer 38 to the undercoating layer 36. The stronger bonding and improved adhesion provided by the second adhesion layer 42 reduce, or substantially eliminate, the formation of voids between the top coating layer 38 and the undercoating layer 36, and between the top coating layer 38 and the plurality of chip capacitors 16.

Figure 10:
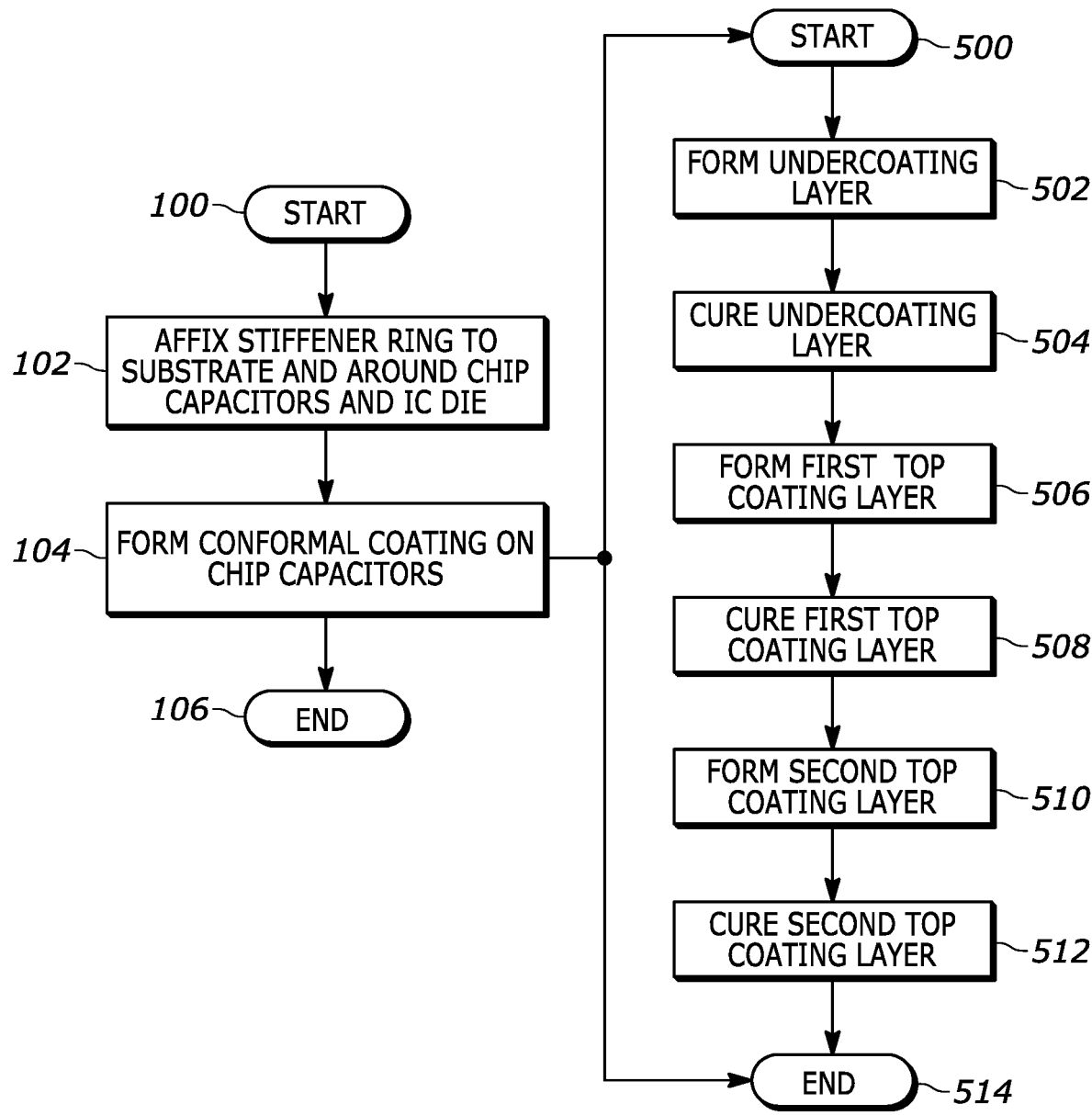
FIG. 10 is a flowchart illustrating another process for conformally coating a plurality of passive surface mount components in accordance with one example set forth in the disclosure.

FIG. 10 is a flowchart illustrating process for conformally coating the plurality of chip capacitors 16 in accordance with another example set forth in the disclosure. Considering FIGS. 1, 2, 5 and 10 together, the process of forming the conformal coating 20 starts, for example, with the integrated circuit die 14 and the plurality of chip capacitors 16 soldered to the substrate 12 and with the stiffener ring 18 affixed to the substrate 12, as shown at block 500. The undercoating layer 36 is formed by dispensing the underfill resin, as described above, onto the first adhesion layer 40 around a periphery of the plurality of chip capacitors 16 at block 502. Capillary action draws some of the underfill resin into the spaces between the plurality of chip capacitors 16 and the substrate 12. The undercoating layer 36 is then cured at block 504 by the process described above in reference to block 204 of FIG. 7, for example.

The first top coating layer 44 of the top coating layer 38 is formed by dispensing the coating resin (or alternatively, an epoxy-based polymer), as described above, onto the undercoating layer 36 around a periphery of the plurality of chip capacitors 16, at block 506. The first top coating layer 38 is then cured at block 508 by any of the processes described above in reference to block 208 of FIG. 7, for example. The second top coating layer 46 of the top coating layer 38 is formed by dispensing the coating resin, as described above, over each of the chip capacitors 16 and over the first top coating layer 44, at block 510. The second top coating layer 46 is then cured at block 512 by any of the processes described above in reference to block 208 of FIG. 7, for example. The process then continues as shown in block 514 to produce the electrical device 10 with the conformally coated chip capacitors 16.

Without wishing to be bound by any theories, it is believed that forming the top coating layer 38 in two parts reduces stresses in the top coating layer 38, particularly at the edges of the plurality of chip capacitors 16. The first top coating layer 44 substantially planarizes the area around the plurality of chip capacitors 16 and does not cover the edges of the plurality of chip capacitors 16 to any significant extent. Thus, after cure, any stresses formed in the first top coating layer 44 at the edges of the plurality of chip capacitors 16 are significantly less than in the embodiments in which the entire top coating layer 38 covers the edges of the plurality of chip capacitors 16 at once and is cured at once. The second top coating layer 46 is formed on the substantially planarized surface of the plurality of chip capacitors 16 and the cured first top coating layer 44. Thus, any exposed edges of the plurality of chip capacitors 16 are significantly reduced in size, reducing any stresses formed in the second top coating layer 46 at the edges of the plurality of chip capacitors 16.

Although the examples of FIGS. 7, 8, 9 and 10 are illustrated as separate processes for ease of illustration and understanding, it is understood that the disclosure includes processes that combine elements of all four processes.

Although the examples described above disclose chip capacitors as the passive surface mount components, it is understood that examples including chip resistors or other passive surface mount components in addition to, or in place of, chip capacitors are also encompassed by this disclosure.

As used herein, the phrase "within any range defined between any two of the foregoing values" literally means that any range may be selected from any two of the values listed prior to such phrase regardless of whether the values are in the lower part of the listing or in the higher part of the listing. For example, a pair of values may be selected from two lower values, two higher values, or a lower value and a higher value.

The above detailed description and the examples described therein have been presented for the purposes of illustration and description only and not for limitation. For example, the operations described are done in any suitable manner. The operations described herein are be performed in any suitable order and the order provided is only given for purposes of example. It is therefore contemplated that the present implementations cover any and all modifications, variations or equivalents that fall within the scope of the basic underlying principles disclosed above and claimed herein. Furthermore, while the above description describes hardware in the form of a processor executing code, hardware in the form of a state machine or dedicated logic capable of producing the same effect, other structures are also contemplated.

What is claimed is:

1. A process for conformally coating a plurality of passive surface mount components soldered to a printed circuit substrate of a lidless flip-chip ball grid array package, the package further containing an integrated circuit die soldered to the substrate, the process comprising:
    affixing a stiffener ring to the substrate having the soldered passive surface mount components and the soldered integrated circuit die, the plurality of passive surface mount components and the integrated circuit die contained within an opening formed by the stiffener ring, wherein at least some of the plurality of passive surface mount components are disposed in a plurality of adjacent rows; and
    forming a conformal coating on the plurality of passive surface mount components after affixing the stiffener ring to the substrate, the conformal coating extending over each of the passive surface mount components, around a periphery of each of the passive surface mount components, and under each of the passive surface mount components.

2. The process of claim 1, wherein the plurality of passive surface mount components comprises a plurality of chip capacitors.

3. The process of claim 2, wherein forming the conformal coating comprises:
    forming an undercoating layer on the plurality of chip capacitors, the undercoating layer extending around the periphery of each of the chip capacitors and under each of the chip capacitors between each of the chip capacitors and the substrate; and
    forming a top coating layer, the top coating layer disposed over each of the chip capacitors and over the undercoating layer.

4. The process of claim 3, further comprising:
    curing the undercoating layer; and
    curing the top coating layer.

5. The process of claim 3, further comprising treating the substrate and the plurality of chip capacitors with a first plasma before forming the conformal coating.

6. The process of claim 3, further comprising forming a first adhesion layer on the substrate and on the plurality of chip capacitors before forming the conformal coating on the plurality of chip capacitors.

7. The process of claim 5, wherein the first plasma is formed from gases including helium, argon, oxygen, or any combination thereof.

8. The process of claim 5, further comprising treating the undercoating layer with a second plasma.

9. The process of claim 6, further comprising forming a second adhesion layer on the undercoating layer and on the plurality of chip capacitors before forming the top coating layer.

10. The process of claim 8, wherein the second plasma is formed from gases including helium, argon, oxygen, or any combination thereof.

11. An electronic device packaged in a lidless flip-chip ball grid array package, the device comprising:
    a printed circuit substrate including a ball grid array;
    an integrated circuit die soldered to the substrate;
    a plurality of passive surface mount components soldered to the substrate, at least some of the plurality of passive surface mount components disposed in a plurality of adjacent rows;
    a stiffener ring affixed to the substrate, the plurality of passive surface mount components and the integrated circuit die contained within an opening formed by the stiffener ring; and
    a conformal coating disposed over the plurality of passive surface mount components, the conformal coating extending over each of the passive surface mount components, around a periphery of each of the passive surface mount components, and under each of the passive surface mount components.

12. The device of claim 11, wherein the plurality of passive surface mount components comprises a plurality of chip capacitors.

13. The device of claim 12, wherein the conformal coating comprises:
    an undercoating layer on the plurality of chip capacitors, the undercoating layer extending around the periphery of each of the chip capacitors and under each of the chip capacitors between each of the chip capacitors and the substrate; and
    a top coating layer, the top coating layer disposed over each of the chip capacitors and over the undercoating layer.

14. The device of claim 13, further comprising a first adhesion layer on the substrate and on the plurality of chip capacitors.

15. The device of claim 14, further comprising a second adhesion layer on the undercoating layer and the plurality of chip capacitors before forming the top coating layer.

16. An electronic device comprising:
    a printed circuit substrate including a ball grid array;
    an integrated circuit die soldered to the substrate;
    a plurality of passive surface mount components soldered to the substrate, at least some of the plurality of passive surface mount components disposed in a plurality of adjacent rows;
    a stiffener ring affixed to the substrate, the plurality of passive surface mount components and the integrated circuit die contained within an opening formed by the stiffener ring; and
    a conformal coating disposed over the plurality of passive surface mount components, the conformal coating comprising:
        a first adhesion layer disposed on the substrate and on each of the passive surface mount components;
        an undercoating layer disposed on the first adhesion layer and extending around a periphery of each of the passive surface mount components and under each of the passive surface mount components, between each of the passive surface mount components and the substrate;

a second adhesion layer disposed on the undercoating layer and on each of the passive surface mount components; and
a top coating layer disposed on the second adhesion layer.

17. The device of claim 16, wherein the integrated circuit die comprises a plurality of central processing unit cores and the plurality of passive surface mount components comprises a plurality of chip capacitors.

18. The device of claim 17, wherein the first adhesion layer and the second adhesion layer include a phosphonate-based self-assembled monolayer.

19. A process for conformally coating a plurality of passive surface mount components soldered to a printed circuit substrate of a lidless flip-chip ball grid array package, the package further containing an integrated circuit die soldered to the substrate, the process comprising:
  affixing a stiffener ring to the substrate having the soldered passive surface mount components and the soldered integrated circuit die, the plurality of passive surface mount components and the integrated circuit die contained within an opening formed by the stiffener ring, wherein at least some of the plurality of passive surface mount components are disposed in a plurality of adjacent rows; and
  forming a conformal coating on the plurality of passive surface mount components after affixing the stiffener ring to the substrate, the conformal coating extending over each of the passive surface mount components, around a periphery of each of the passive surface mount components, and under each of the passive surface mount components, wherein forming the conformal coating comprises:
    forming an undercoating layer on the plurality of passive surface mount components, the undercoating layer extending around the periphery of each of the passive surface mount components and under each of the passive surface mount components between each of the passive surface mount components and the substrate;
    curing the undercoating layer;
    forming a first top coating layer, the first top coating layer disposed over the undercoating layer;
    curing the first top coating layer;
    forming a second top coating layer, the second top coating layer disposed over each of the passive surface mount components and over the cured first undercoating layer; and
    curing the second top coating layer.

20. The process of claim 19, wherein the plurality of passive surface mount components comprises a plurality of chip capacitors.

21. The process of claim 19, wherein curing the first top coating layer comprises:
  baking first top coating layer at a temperature from 95° C. to 105° for from 50 minutes to 70 minutes; and
  baking the first top coating layer at a temperature from 145° C. to 155° C. for from 110 minutes to 130 minutes.

22. The process of claim 19, wherein curing the second top coating layer comprises:
  baking second top coating layer at a temperature from 95° C. to 105° for from 50 minutes to 70 minutes; and
  baking the second top coating layer at a temperature from 145° C. to 155° C. for from 110 minutes to 130 minutes.

23. The process of claim 19, further comprising treating the substrate and the plurality of passive surface mount components with a plasma before forming the conformal coating.

24. The process of claim 19, further comprising forming a first adhesion layer on the substrate and on the plurality of passive surface mount components before forming the conformal coating on the plurality of passive surface mount components.

25. The process of claim 23, further comprising treating the undercoating layer with a second plasma before forming the first top coating layer.

26. The process of claim 24 further comprising forming a second adhesion layer on the undercoating layer and on the plurality of passive surface mount components before forming the first top coating layer.

27. An electronic device packaged in a lidless flip-chip ball grid array package, the device comprising:
  a printed circuit substrate including a ball grid array;
  an integrated circuit die soldered to the substrate;
  a plurality of passive surface mount components soldered to the substrate, at least some of the plurality of passive surface mount components disposed in a plurality of adjacent rows;
  a stiffener ring affixed to the substrate, the plurality of passive surface mount components and the integrated circuit die contained within an opening formed by the stiffener ring; and
  a conformal coating disposed over the plurality of passive surface mount components, the device made by:
    affixing the stiffener ring to the substrate; and
    forming the conformal coating on the plurality of passive surface mount components after affixing the stiffener ring to the substrate, the conformal coating extending over each of the passive surface mount components, around a periphery of each of the passive surface mount components, and under each of the passive surface mount components, wherein forming the conformal coating comprises:
      forming an undercoating layer on the plurality of passive surface mount components, the undercoating layer extending around the periphery of each of the passive surface mount components and under each of the passive surface mount components between each of the passive surface mount components and the substrate;
      curing the undercoating layer;
      forming a first top coating layer, the first top coating layer disposed over the undercoating layer;
      curing the first top coating layer;
      forming a second top coating layer, the second top coating layer disposed over each of the passive surface mount components and over the first undercoating layer; and
      curing the second top coating layer.

28. The device of claim 27, wherein the plurality of passive surface mount components comprises a plurality of chip capacitors.

29. The device of claim 27, wherein curing the first top coating layer comprises:
  baking first top coating layer at a temperature from 95° C. to 105° for from 50 minutes to 70 minutes; and
  baking the first top coating layer at a temperature from 145° C. to 155° C. for from 110 minutes to 130 minutes.

30. The device of claim 27, wherein curing the second top coating layer comprises:

baking second top coating layer at a temperature from 95° C. to 105° for from 50 minutes to 70 minutes; and baking the second top coating layer at a temperature from 145° C. to 155° C. for from 110 minutes to 130 minutes.

31. The device of claim 29, further made by forming a first adhesion layer on the substrate and on the plurality of passive surface mount components before forming the conformal coating on the plurality of passive surface mount components.

32. The device of claim 27, further made by treating the substrate and the plurality of passive surface mount components with a first plasma before forming the undercoating layer.

33. The device of claim 31, further made by forming a second adhesion layer on the undercoating layer and the plurality of passive surface mount components before forming the first top coating layer.

34. The device of claim 32, further made by treating the undercoating layer with a second plasma, the second plasma formed from gases including helium, argon, oxygen or any combination thereof.

\* \* \* \* \*